(12) United States Patent
Chen et al.

(10) Patent No.: US 7,199,422 B2
(45) Date of Patent: Apr. 3, 2007

(54) CONTACTLESS UNIFORM-TUNNELING SEPARATE P-WELL (CUSP) NON-VOLATILE MEMORY ARRAY ARCHITECTURE, FABRICATION AND OPERATION

(75) Inventors: Chun Chen, Boise, ID (US); Andrei Mihnea, Boise, ID (US); Kirk Prall, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 180 days.

(21) Appl. No.: 11/006,177

(22) Filed: Dec. 6, 2004

(65) Prior Publication Data

US 2005/0099846 A1    May 12, 2005

Related U.S. Application Data

(62) Division of application No. 10/665,251, filed on Sep. 4, 2003, now Pat. No. 6,930,350, which is a division of application No. 10/230,597, filed on Aug. 29, 2002, now Pat. No. 6,649,453.

(51) Int. Cl.
*H01L 29/788* (2006.01)

(52) U.S. Cl. .............. 257/315; 257/314; 257/E27.067; 365/185.11; 365/185.14

(58) Field of Classification Search ............... 257/315, 257/316.3, 71; 365/185.11, 185.15
See application file for complete search history.

(56) References Cited

U.S. PATENT DOCUMENTS

| | | | |
|---|---|---|---|
| 5,343,423 A | 8/1994 | Shimoji | |
| 5,487,033 A | 1/1996 | Keeney et al. | |
| 5,515,319 A | 5/1996 | Smayling et al. | |
| 5,691,938 A | 11/1997 | Yiu et al. | |
| 5,945,698 A | 8/1999 | Prall | |
| 5,973,352 A | 10/1999 | Noble | |
| 5,973,356 A | 10/1999 | Noble | |
| 6,067,251 A * | 5/2000 | Hirano | 365/185.18 |
| 6,080,672 A | 6/2000 | Juengling | |
| 6,137,723 A | 10/2000 | Bergemont et al. | |
| 6,160,277 A | 12/2000 | Prall | |
| 6,181,601 B1 | 1/2001 | Chi | |
| 6,191,444 B1 | 2/2001 | Clampitt | |
| 6,218,698 B1 | 4/2001 | Hai | |
| 6,272,047 B1 | 8/2001 | Mihnea | |
| 6,319,774 B1 | 11/2001 | Hai | |
| 6,337,244 B1 | 1/2002 | Prall | |

(Continued)

OTHER PUBLICATIONS

Li, et al. *A Novel Uniform-Channel-Program-Erase (UCPE) Flash EEPROM Using an Isolated P-well Structure* 2000 IEEE (4 pgs.).

Primary Examiner—Andy Huynh
Assistant Examiner—Thinh T Nguyen
(74) Attorney, Agent, or Firm—Leffert, Jay & Polglaze P.A.

(57) ABSTRACT

Floating-gate field-effect transistors or memory cells formed in isolated wells are useful in the fabrication of non-volatile memory arrays and devices. A column of such floating-gate memory cells are associated with a well containing the source/drain regions for each memory cell in the column. These wells are isolated from source/drain regions of other columns of the array. Fowler-Nordheim tunneling can be used to program and erase such floating-gate memory cells either on an individual basis or on a bulk or block basis.

4 Claims, 9 Drawing Sheets

U.S. PATENT DOCUMENTS

| | | |
|---|---|---|
| 6,406,959 B2 | 6/2002 | Prall |
| 6,441,428 B1 | 8/2002 | Ghodsi |
| 6,489,665 B2 | 12/2002 | Prall |
| 6,545,310 B2 | 4/2003 | Li et al. |
| 2002/0044483 A1 | 4/2002 | Prall |
| 2002/0101765 A1 | 8/2002 | Mihnea |

* cited by examiner

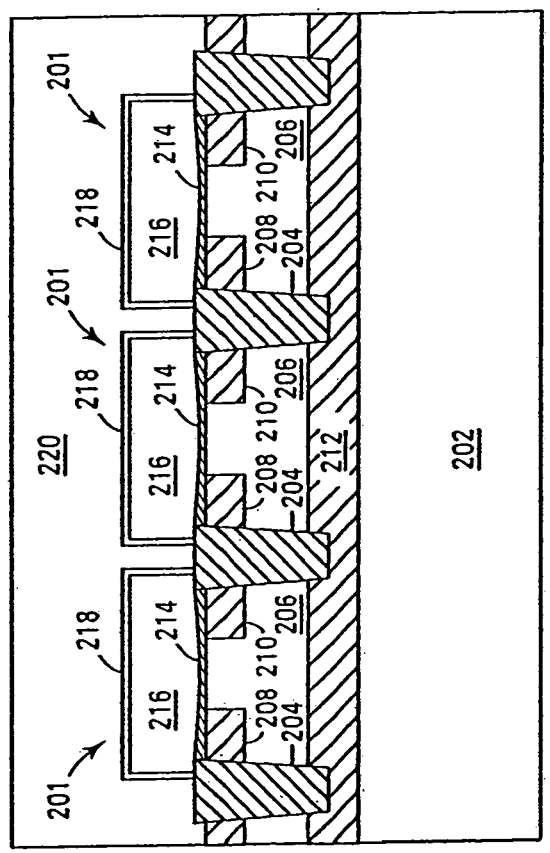
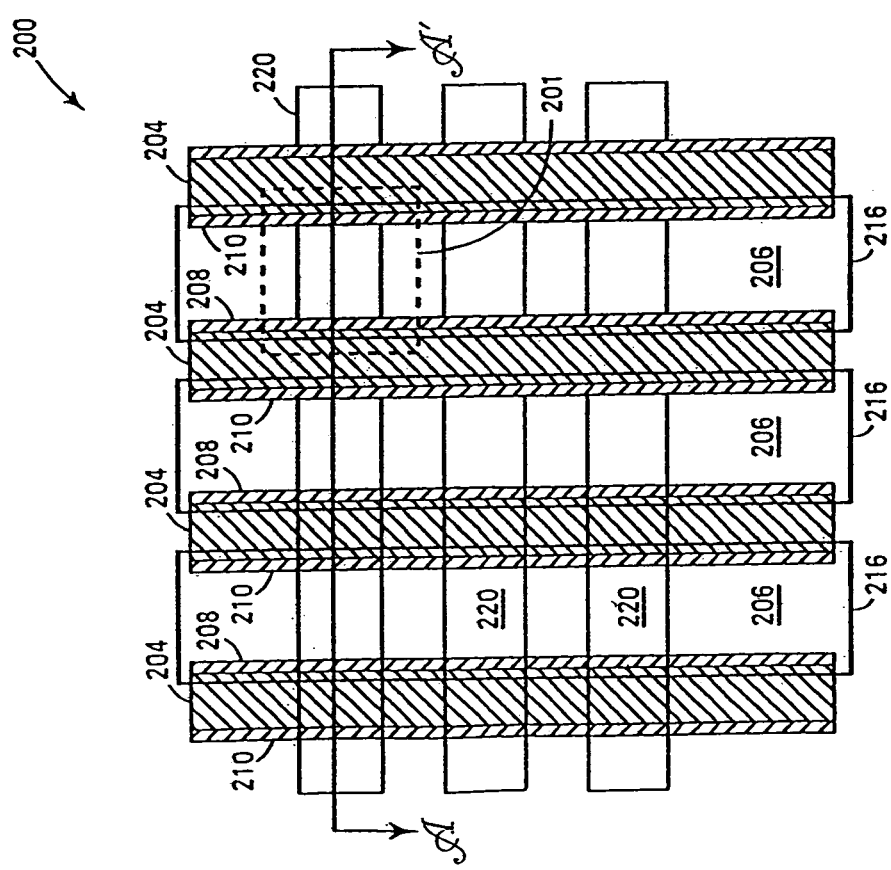
Fig. 2B
Fig. 2A

CONTACTLESS UNIFORM-TUNNELING SEPARATE P-WELL (CUSP) NON-VOLATILE MEMORY ARRAY ARCHITECTURE, FABRICATION AND OPERATION

RELATED APPLICATION

This application is a divisional of U.S. patent application Ser. No. 10/655,251, filed Sep. 4, 2003 now U.S. Pat. No. 6,930,350 and titled, "CONTACTLESS UNIFORM TUNNELING SEPARATE P-WELL (CUSP) NON-VOLATILE MEMORY ARRAY ARCHITECTURE, FABRICATION AND OPERATION," which is a divisional of U.S. patent application Ser. No. 10/230,597, filed Aug. 29, 2002 now U.S. Pat. No. 6,649,453 and titled, "CONTACTLESS UNIFORM TUNNELING SEPARATE P-WELL (CUSP) NON-VOLATILE MEMORY ARRAY ARCHITECTURE, FABRICATION AND OPERATION," both of which are commonly assigned and incorporated by reference in their entirety herein.

TECHNICAL FIELD OF THE INVENTION

The present invention relates generally to non-volatile memory cells and in particular the present invention relates to flash memory cells.

BACKGROUND OF THE INVENTION

Memory devices are available in a variety of styles and sizes. Some memory devices are volatile in nature and cannot retain data without an active power supply. A typical volatile memory is a DRAM which includes memory cells formed as capacitors. A charge, or lack of charge, on the capacitors indicate a binary state of data stored in the memory cell. Dynamic memory devices require more effort to retain data than non-volatile memories, but are typically faster to read and write.

Non-volatile memory devices are also available in different configurations. For example, floating gate memory devices are non-volatile memories that use floating gate transistors to store data. The data is written to the memory cells by changing a threshold voltage of the transistor and is retained when the power is removed. The transistors can be erased to restore the threshold voltage of the transistor. The memory may be arranged in erase blocks where all of the memory cells in an erase block are erased at one time. Such non-volatile memory devices are commonly referred to as flash memories.

The non-volatile memory cells are fabricated as floating gate memory cells and include a source region and a drain region that is laterally spaced apart from the source region to form an intermediate channel region. The source and drain regions are formed in a common horizontal plane of a silicon substrate. A floating gate, typically made of doped polysilicon, is disposed over the channel region and is electrically isolated from the other cell elements by a dielectric. For example, a gate oxide can be formed between the floating gate and the channel region. A control gate is located over the floating gate and is can also be made of doped polysilicon. The control gate is electrically separated from the floating gate by another dielectric layer. Thus, the floating gate is "floating" in dielectric so that it is insulated from both the channel and the control gate.

As semiconductor devices get smaller in size, designers are faced with problems associated with the production of memory cells that consume a small enough amount of surface area to meet design criteria, yet maintain sufficient performance in spite of this smaller size.

For the reasons stated above, and for other reasons stated below which will become apparent to those skilled in the art upon reading and understanding the present specification, there is a need in the art for alternative memory device architectures.

SUMMARY

The above-mentioned problems with non-volatile memory cells and other problems are addressed by the present invention and will be understood by reading and studying the following specification.

The various embodiments relate to non-volatile semiconductor memory cells, arrays, as well as their fabrication and architecture. Such memory cells can use Fowler-Nordheim (FN) tunneling during both program and erase operations while maintaining random access capabilities. Due to the nature of FN tunneling, the memory cells can operate at relatively low power consumption. Additionally, because of the low power consumption of FN tunneling compared to hot-electron processes, many, e.g., thousands, of cells may be programmed or erased in parallel. While parallel programming and erase operations are suitable for large blocks of memory cells, cells may be programmed or erased individually while still facilitating a smaller cell size than a typical electrically-erasable programmable read-only memory (EEPROM).

For one embodiment, the invention provides an array of floating-gate field-effect transistors. The array includes two or more columns of the floating-gate field-effect transistors, each field-effect transistor of a column sharing a first source/drain region and a second source/drain region with other field-effect transistors of that column. The first and second source/drain regions of a column are contained in a first well having a first conductivity type. The first well for each column is isolated from first wells of other columns.

For another embodiment, the invention provides a method of erasing a memory cell in an array of memory cells. The method includes applying a first potential to a word line associated with the memory cell, applying a second potential to a first source/drain region and a second source/drain region of the memory cell, and applying the second potential to a first well containing the first and second source/drain regions. The method further includes applying a third potential to a second well. The second well is underlying the first well and is coupled to the first well through a PN junction.

For yet another embodiment, the invention provides a method of programming a memory cell in an array of memory cells. The method includes applying a first potential to a word line associated with the memory cell, applying a second potential to a first source/drain region and a second source/drain region of the memory cell, and applying a third potential to a first well containing the first and second source/drain regions. The method further includes applying the third potential to a second well underlying the first well. The second well is coupled to the first well through a PN junction and the third potential has the second polarity.

For still another embodiment, the invention provides a non-volatile memory device. The memory device includes an array of non-volatile floating-gate memory cells arranged in rows and columns and control circuitry for controlling access to the array of memory cells. Each column of memory cells shares a source and a drain, the source and drain for a column of memory cells being contained in a first well associated with that column of memory cells. The first well associated with each column of memory cells is isolated from other first wells of other columns of memory cells. Each first well is overlying a second well in a many-to-one relationship and each first well has a first conductivity type. The second well has a second conductivity type different than the first conductivity type.

Further embodiments of the invention include methods and apparatus of varying scope.

BRIEF DESCRIPTION OF THE DRAWINGS

FIG. 2A is a planar view of an array of field-effect transistors (FETs) in accordance with one embodiment of the invention.

FIG. 2B is a cross-sectional view of a portion of the array of FETs of FIG. 2A.

DETAILED DESCRIPTION

Figure 1A:
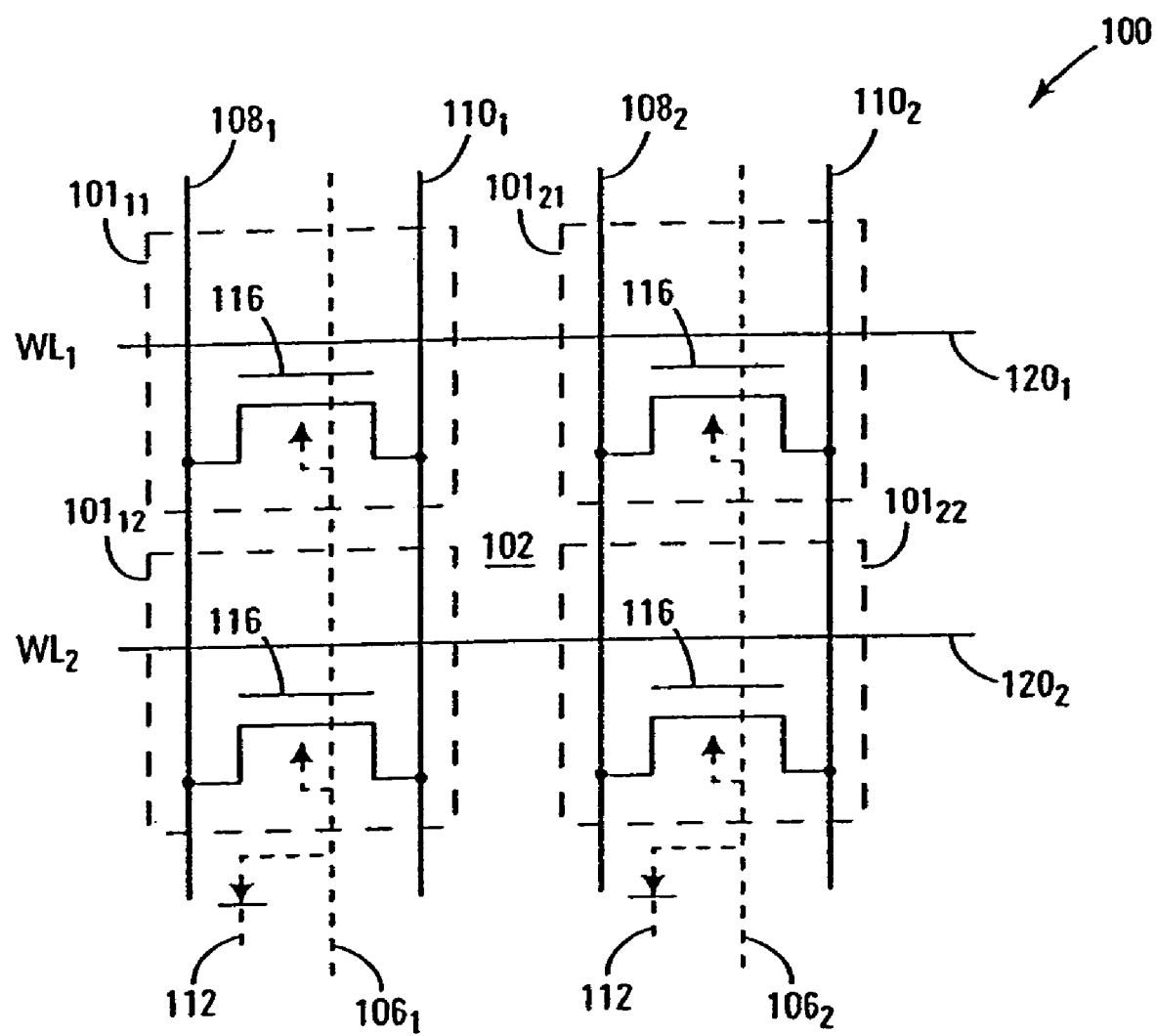
FIG. 1A is a schematic of an array of memory cells formed in accordance with one embodiment of the invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

To aid in the interpretation of the detailed description and claims that follow, the term "semiconductor substrate" is defined to mean any construction comprising semiconductive material, including, but not limited to, bulk semiconductive materials such as a semiconductor wafer (either alone or in assemblies comprising other materials thereon) and semiconductive material layers (either alone or in assemblies comprising other materials). The term "substrate" refers to any supporting structure, including, but not limited to, the semiconductor substrates described above. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art.

In addition, as the structures formed by embodiments in accordance with the present invention are described herein, common semiconductor terminology such as n-type, p-type, n+ and p+ will be employed to describe the type of conductivity doping used for the various structures or regions being described. The specific levels of doping are not believed to be germane to embodiments of the present invention; thus, it will be understood that while specific dopant species and concentrations may not be mentioned, an appropriate dopant species with an appropriate concentration to its purpose, is employed.

The term conductor is understood to also include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

Finally, it will be understood that the number, relative size and spacing of the structures depicted in the accompanying figures are exemplary only, and thus were selected for ease of explanation and understanding. Therefore such representations are not indicative of the actual number or relative size and spacing of an operative embodiment in accordance with the present invention.

FIG. 1A is a schematic of an array 100 of memory cells 101 in accordance with an embodiment of the invention. The memory cells 101 are supported by a substrate 102. Each memory cell 101 is an FET including a control gate provided in FIG. 1A by a word line 120, a floating gate 116, a first source/drain region 108 and a second source/drain region 110. One source/drain region acts as a source while the remaining source/drain region acts as a drain for the FET.

A column of memory cells 101 is defined as those memory cells 101 sharing the same source/drain regions 108 and 110, e.g., memory cells $101_{11}$ and $101_{12}$ are in the same column. A row of memory cells 101 is defined as those memory cells 101 sharing the same word line 120, e.g., memory cells $101_{11}$ and $101_{21}$ are in the same row. Although only two columns and two rows are depicted in FIG. 1A, a typical array may contain hundreds and even thousands of rows and columns.

The body of each memory cell 101 in a column of memory cells 101 is coupled to a first node 106. A first node 106 of a first column of memory cells 101 is isolated from other first nodes 106 of other columns of memory cells 101 within the array 100, in part by a second node 112 having a different conductivity type than the first nodes 106. The first nodes 106 are each coupled to the second node 112 through a PN junction.

Table 1 demonstrates operations to the memory array 100 for one embodiment of the invention. Although specific potentials are listed in Table 1, it will be appreciated by those skilled in the art that other potentials can be specified to create the necessary voltage differential to exceed a threshold voltage of a target memory cell during a read operation or to provide the necessary voltage differentials to facilitate FN tunneling to add charge to, or remove charge from, the floating gate 116 of a target memory cell. As such, the various embodiments are not limited to the specific potentials listed in Table 1.

TABLE 1

Bias Conditions during Array Operations
(Assuming memory cell $101_{11}$ as the Target Memory Cell)

| | Op | | | | |
|---|---|---|---|---|---|
| Node | Read Target | Erase Target | Program Target | Erase All | Program All |
| $120_1$ | Vwr | V1 | V2 | V1 | V2 |
| $108_1$ | Vdr | V2 | V1 | V2 | V1 |
| $110_1$ | 0 V | V2 | V1 | V2 | V1 |
| $106_1$ | 0 V | V2 | V1 | V2 | V1 |
| $120_2$ | 0 V | 0 V | 0 V | V1 | V2 |
| $108_2$ | 0 V | 0 V | 0 V | V2 | V1 |
| $110_2$ | 0 V | 0 V | 0 V | V2 | V1 |

TABLE 1-continued

Bias Conditions during Array Operations
(Assuming memory cell $101_{11}$ as the Target Memory Cell)

| Node | Op | | | | |
|------|---------------|----------------|------------------|--------------|----------------|
|      | Read Target | Erase Target | Program Target | Erase All | Program All |
| $106_2$ | 0 V | 0 V | 0 V | V2 | V1 |
| 112 | 0 V | 0 V | V1 | 0 V | V1 |
| 102 | 0 V | 0 V | 0 V | 0 V | 0 V |

Appropriate potentials are generally in the range of approximately 5V to 15V for V1 and approximately −5V to −15V for V2.

For Table 1, node $120_2$ represents all word lines 120 for rows not containing the target memory cell $101_{11}$, node $108_2$ represents all first source/drain regions 108 for columns not containing the target memory cell $101_{11}$, node $110_2$ represents all second source/drain regions 110 for columns not containing the target memory cell $101_{11}$, and node $106_2$ represents all first nodes 106 for columns not containing the target memory cell $101_{11}$.

As shown in Table 1, for one embodiment, reading the target memory cell $101_{11}$ of the array 100 may be performed by applying a read voltage Vwr, e.g., 4.5V, to the word line $120_1$ of the target memory cell, applying a bias Vdr, e.g., 1V, to a first source/drain region $108_1$ of the target memory cell and detecting a current at the first source/drain region $108_1$, or current or potential at the second source/drain region $110_1$. The read voltage is some voltage in excess of the threshold voltage for the conductive cell that will not cause a read disturb, i.e., a change of a data value of the cell. During this read operation, the first node $106_1$ of the target memory cell and the second node 112 are each brought to a ground potential. Remaining word lines $120_2$, first source/drain regions $108_2$, second source/drain regions $110_2$, first nodes $106_2$ and the substrate 102 are also brought to a ground potential.

Erasing typically refers to bringing a group of memory cells to a uniform state, i.e., a first logic state, usually in preparation for an ensuing programming operation. As shown in Table 1, for one embodiment, erasing the target memory cell $101_{11}$ of the array 100 may be performed by applying a first programming voltage having a first polarity (V1), e.g., 8V, to the word line $120_1$ of the target memory cell and applying a second programming voltage having a second polarity (V2), e.g., −8V, to a first source/drain region $108_1$, second source/drain region $110_1$ and first node $106_1$ of the target memory cell. Remaining nodes, i.e., the second node 112, word lines $120_2$, first source/drain regions $108_2$, second source/drain regions $110_2$, first nodes $106_2$ and the substrate 102 are brought to a ground potential. To erase all memory cells of the array 100, the word lines $120_2$, are brought to the first programming voltage instead of the ground potential and the first source/drain regions $108_2$, second source/drain regions $110_2$ and first nodes $106_2$ are brought to the second programming voltage instead of the ground potential.

Programming typically refers to a final step in a process of bringing a memory cell or group of memory cells to physical states, i.e., second logic states, that represent a data pattern to be stored in the array. Thus, a data pattern may be stored in the array 100 by placing all of the memory cells in the first logic state and then placing one or more memory cells in the second logic state. As shown in Table 1, for one embodiment, programming the target memory cell $101_{11}$ of the array 100 may be performed by applying the second programming voltage having the second polarity (V2), e.g., −8V, to the word line $120_1$ of the target memory cell and applying the first programming voltage having first polarity (V1), e.g., 8V, to a first source/drain region $108_1$, second source/drain region $110_1$ and first node $106_1$ of the target memory cell, as well as the second node 112. Remaining nodes, i.e., word lines $120_2$, first source/drain regions $108_2$, second source/drain regions $110_2$, first nodes $106_2$ and the substrate 102 are brought to a ground potential. To program all memory cells of the array 100, the word lines $120_2$ are brought to the second programming voltage instead of the ground potential and the first source/drain regions $108_2$, second source/drain regions $110_2$ and first nodes $106_2$ are brought to the first programming voltage instead of the ground potential.

Table 2 demonstrates operations to the memory array 100 for another embodiment of the invention in which voltages of a single polarity are used. Although specific potentials are listed in Table 1, it will be appreciated by those skilled in the art that other potentials can be specified to create the necessary voltage differential to exceed a threshold voltage of a target memory cell during a read operation or to provide the necessary voltage differentials to facilitate FN tunneling to add charge to, or remove charge from, the floating gate 116 of a target memory cell. As such, the various embodiments are not limited to the specific potentials listed in Table 2.

TABLE 2

Bias Conditions during Array Operations
(Assuming memory cell $101_{11}$ as the Target Memory Cell)

| Node | Op | | | | |
|------|---------------|----------------|------------------|--------------|----------------|
|      | Read Target | Erase Target | Program Target | Erase All | Program All |
| $120_1$ | Vwr | Vhi | Vlo | Vhi | Vlo |
| $108_1$ | Vdr | Vlo | Vhi | Vlo | Vhi |
| $110_1$ | 0 V | Vlo | Vhi | Vlo | Vhi |
| $106_1$ | 0 V | Vlo | Vhi | Vlo | Vhi |
| $120_2$ | 0 V | Vmed or Vlo | Vmed | Vhi | Vlo |
| $108_2$ | 0 V | Vmed | Vmed or Vlo | Vhi | Vhi |
| $110_2$ | 0 V | Vmed | Vmed or Vlo | Vhi | Vhi |
| $106_2$ | 0 V | Vmed | Vmed or Vlo | Vhi | Vhi |
| 112 | 0 V | Vmed | Vhi | Vlo | Vhi |
| 102 | 0 V | 0 V | 0 V | 0 V | 0 V |

Appropriate potentials are generally in the range of approximately 0V to 1V for Vlo, 6V to 12V for Vmed and 12V to 30V for Vhi.

For Table 2, node $120_2$ represents all word lines 120 for rows not containing the target memory cell $101_{11}$, node $108_2$ represents all first source/drain regions 108 for columns not containing the target memory cell $101_{11}$, node $110_2$ represents all second source/drain regions 110 for columns not containing the target memory cell $101_{11}$, and node $106_2$ represents all first nodes 106 for columns not containing the target memory cell $101_{11}$.

As shown in Table 2, for one embodiment, reading the target memory cell $101_{11}$ of the array 100 may be performed by applying a read voltage Vwr, e.g., 4.5V, to the word line $120_1$ of the target memory cell, applying a bias Vdr, e.g., 1V to a first source/drain region $108_1$ of the target memory cell and detecting a current at the first source/drain region $108_1$, or a current or potential at the second source/drain region $110_1$. The read voltage is ome voltage in excess of the threshold voltage for the conductive cell that will not cause a read disturb, i.e., a change of a data value of the cell. During this read operation, the first node $106_1$ of the target memory cell and the second node 112 are each brought to a ground potential. Remaining word lines $120_2$, first source/drain regions $108_2$, second source/drain regions $110_2$, first nodes $106_2$ and the substrate 102 are also brought to a ground potential.

As shown in Table 2, for one embodiment, erasing the target memory cell $101_{11}$ of the array 100 may be performed by applying a first programming voltage (Vhi), e.g., 16V, to the word line $120_1$ of the target memory cell and applying a second programming voltage (Vlo), e.g., 0V, to a first source/drain region $108_1$, second source/drain region $110_1$ and first node $106_1$ of the target memory cell. The second node 112, first source/drain regions $108_2$, second source/drain regions $110_2$ and the first nodes $106_2$ are brought to a third programming voltage (Vmed), e.g., 8V, between the first and second programming voltages. The word lines $120_2$ are brought to either the second or third programming voltage. The substrate 102 is brought to a ground potential. To erase all memory cells of the array 100, the word lines $120_2$, are brought to the first programming voltage instead of the second or third programming voltage, and the first source/drain regions $108_2$, second source/drain regions $110_2$, first nodes $106_2$ and second node 112 are brought to the second programming voltage instead of the third programming voltage.

As shown in Table 2, for one embodiment, programming the target memory cell $101_{11}$ of the array 100 may be performed by applying the second programming voltage (Vlo) to the word line $120_1$ of the target memory cell and applying the first programming voltage (Vhi) to a first source/drain region $108_2$, second source/drain region $110_1$ and first node $106_1$ of the target memory cell, as well as the second node 112. Remaining word lines $120_2$ are brought to the third programming voltage (Vmed), and the first source/drain regions $108_2$, second source/drain regions $110_2$ and first nodes $106_2$ are brought to the second programming voltage (Vlo) or the third programming voltage (Vmed). The substrate 102 is brought to the ground potential. To program all memory cells of the array 100, the word lines $120_2$ are brought to the second programming voltage instead of the third programming voltage and the first source/drain regions $108_2$, second source/drain regions $110_2$ and first nodes $106_2$ are brought to the first programming voltage instead of the second or third programming voltage.

Although in the foregoing description, programming and erase operations were described with reference to the operation of injecting electrons from the floating gate to the channel and the operation of injecting electrons from the channel to the floating gate, respectively, these operations are exchangeable. Accordingly, memory cells with a high Vt or non-conductive state can represent either cells in a programmed state or an erased state.

Figure 1B:
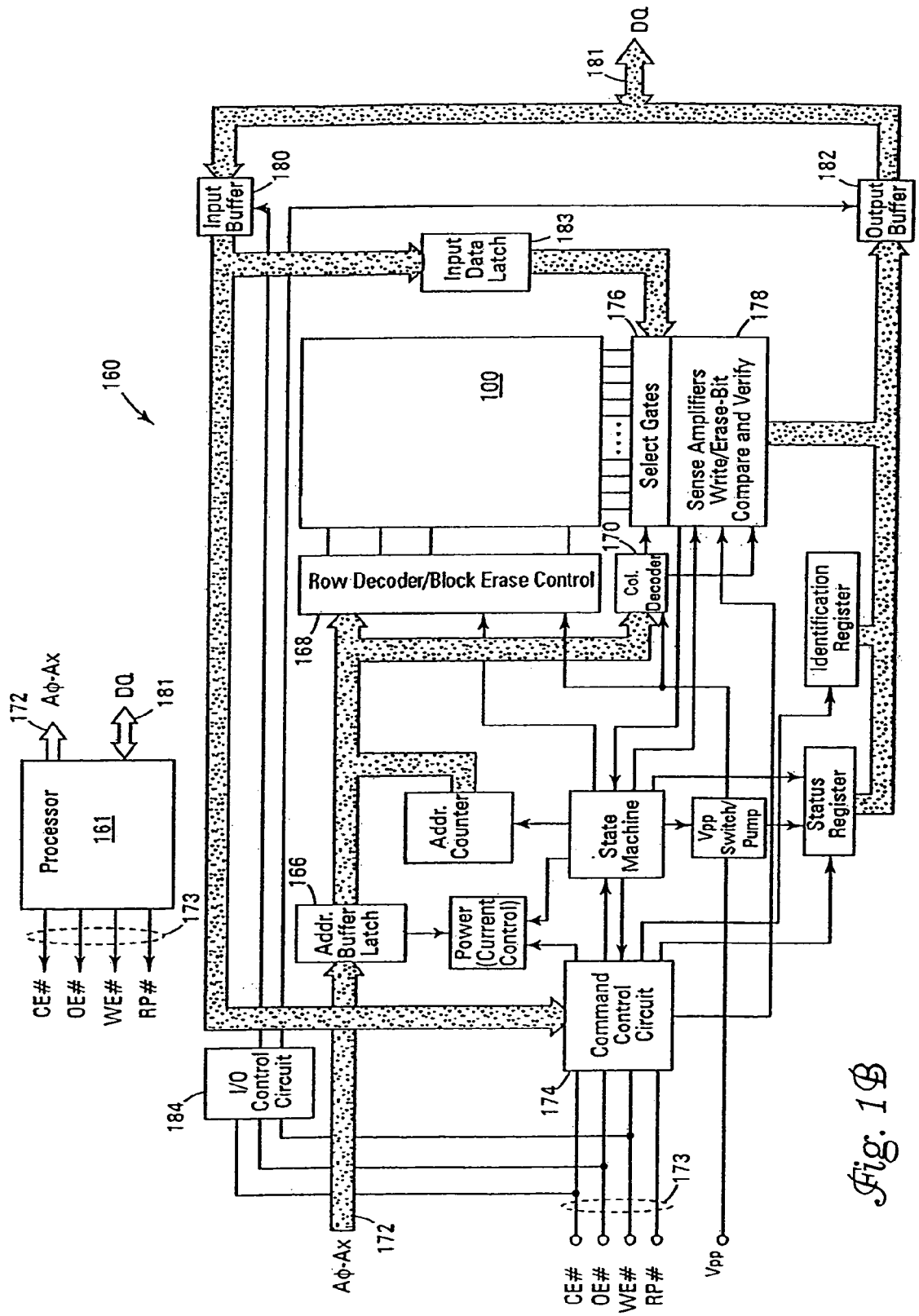
FIG. 1B is a block diagram of a non-volatile memory device in accordance with one embodiment of the invention.

FIG. 1B is a block diagram of a non-volatile or flash memory device 160 in accordance with one embodiment of the invention. The memory device 160 is coupled to a processor 161 to form part of an electronic system. The memory device 160 has been simplified to focus on features of a memory device that are helpful in understanding of the present invention. The memory device 160 includes an array 100 of non-volatile memory cells. The memory cells (not shown in FIG. 1B) are floating-gate memory cells in accordance with the embodiments of the invention. The array is arranged in rows and columns. The rows may be arranged in blocks and the erase operation may be performed on a full block in a manner similar to conventional flash memory. However, the memory cell structure and array organization described herein facilitates individual erasure of selected memory cells independent of any block structure.

A row decoder 168 and a column decoder 170 are provided to decode address signals provided on address lines A0-Ax 172. An address buffer latch circuit 166 is provided to latch the address signals. Address signals are received and decoded to access the memory array 100. A select circuit 176 is provided to select a column of the array identified with the column decoder 170. Sense amplifier and compare circuitry 178 is used to sense data stored in the memory cells and verify the accuracy of stored data. Data input 180 and output 182 buffer circuits are included for bi-directional data communication over a plurality of data (DQ) lines 181 with the processor 161. A data latch 183 is typically provided between input buffer 180 and the memory array 100 for storing data values (to be written to a memory cell) received from the DQ lines 181.

Command control circuit 174 decodes signals provided on control lines 173 from the processor 161. These signals are used to control the operations on the memory array 100, including data read, data write, and erase operations. Input/output control circuit 184 is used to control the input buffer 180 and the output buffer 182 in response to some of the control signals. As stated above, the memory device 160 has been simplified to facilitate a basic understanding of the features of the memory. A more detailed understanding of typical flash memories is known to those skilled in the art.

Arrays of non-volatile memory cells are often arranged in rows and columns of memory cells coupled to word lines and bit lines, respectively. The word lines are coupled to the control gates of the floating-gate memory cells. The bit lines are coupled to the drains of the floating-gate memory cells.

FIGS. 2A–2B are a planar and cross-sectional view, respectively, of an array of field-effect transistors (FETs) in accordance with an embodiment of the invention. The cross-section of FIG. 2B is taken at line A–A' of FIG. 2A.

The array 200 of memory cells 201 is formed on a substrate 202. For one embodiment, the substrate 202 is a monocrystalline material, such as monocrystalline silicon. For a further embodiment, the substrate 202 may be doped to have a conductivity, e.g., a p-type or n-type conductivity.

Each memory cell 201 includes an FET having a gate overlying the substrate 202, two source/drain regions 208 and 210 in the substrate 202 and a channel region defined by the area between the two source/drain regions 208 and 210. The gate of the memory cell 201 includes a control gate provided by conductive material 220, an interlayer dielectric 218, a floating gate 216, and a tunnel dielectric 214.

A column of memory cells is a group of memory cells 201 having their respective first source/drain regions 208 and second source/drain regions 210 connected together. The memory cells 201 of a column of memory cells also share a first or shallow well 206. The first well 206 has a first conductivity type. For one embodiment, the first conductivity type is a p-type conductivity. A first well 206 of a first column of memory cells is separated from other first wells 206 by isolation trenches 204. Each first well 206 contains the first source/drain region 208 and the second source/drain region 210 for a column of memory cells. The source/drain regions 208 and 210 each have a second conductivity type opposite the first conductivity type. For example, with embodiments having a p-type conductivity as the first conductivity type, the second conductivity type is an n-type conductivity. As the first and second source/drain regions 208 and 210 are shared for a column of memory cells, no local contacts are required for individual source/drain regions.

The array 200 of memory cells 201 shares a deep or second well 212 underlying the first wells 206. The second well 212 has the second conductivity type. The second well 212 has a top surface extending above the base of the isolation trenches 204 and a bottom surface extending below the isolation trenches 204.

FIGS. 3A–3F are cross-sectional views of a portion of the memory array 200 during various stages of fabrication in accordance with one embodiment of the invention.

Figure 3A:
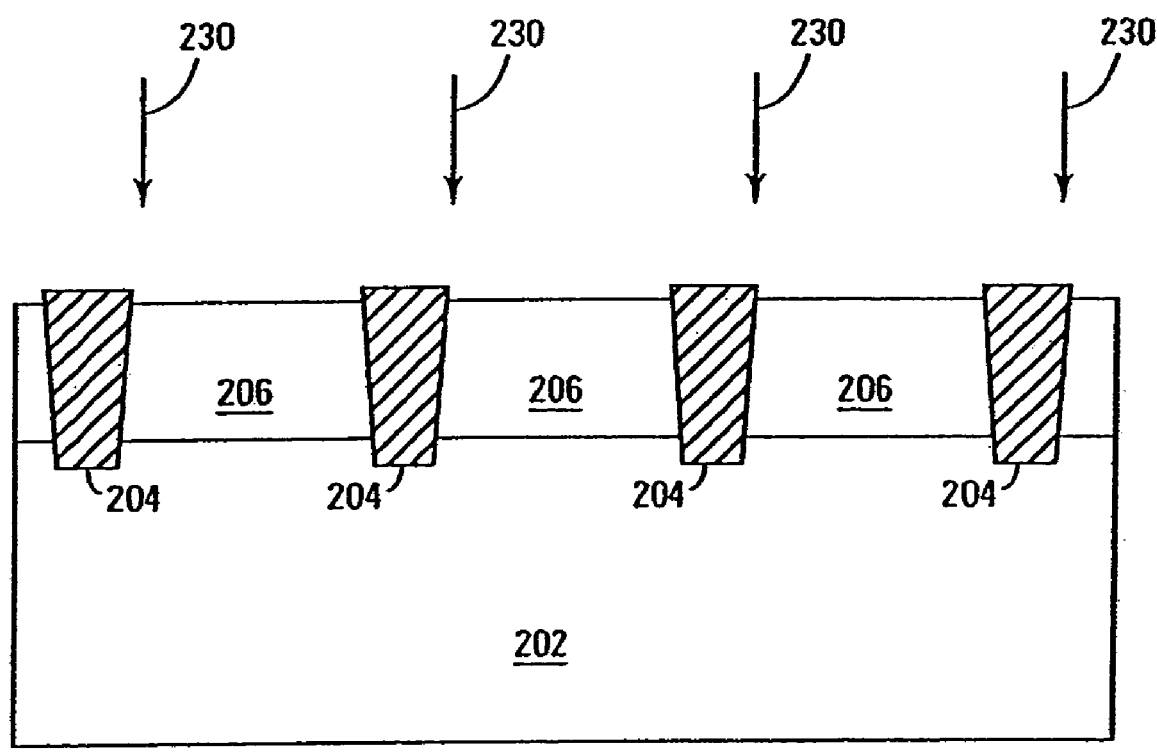
FIGS. 3A–3F are cross-sectional views of a portion of a memory array during various stages of fabrication in accordance with one embodiment of the invention.

In FIG. 3A, isolation trenches 204 have been formed in the substrate 202. The isolation trenches 204 are typically dielectric-filled trenches using any of a variety of shallow trench isolation (STI) techniques. These isolation trenches 204 act as insulative barriers between adjacent portions of the substrate 202.

First wells 206 are formed between the isolation trenches 204. The first wells 206 should have a depth less than the isolation trenches 204 such that each first well 206 is separated from adjacent first wells 206 by an intervening isolation trench 204. However, any excessive depth of the first wells 206 can be overcome during the formation of the second well 212 as described later herein.

As depicted in FIG. 3A, the first wells 206 are formed by doping an exposed portion of the substrate 202 between the isolation trenches 204 with a first dopant species 230 of the appropriate conductivity type. For example, where the first conductivity type is a p-type, the first dopant species 230 may have boron (B) or another p-type impurity. Or, where the first conductivity type is an n-type, the first dopant species 230 may have antimony (Sb), arsenic (As), phosphorus (P) or another n-type impurity.

As an alternative to doping the first wells 206 after formation of the isolation trenches 204, such doping may occur prior to formation of the isolation trenches 204. Doping is usually performed through ion implantation techniques. Dopant sources for ion implantation techniques are often fluorine-based gases. For example, in the ion implantation of boron ions, the source gas may be boron trifluoride ($BF_3$). Thermal processing may be performed following the implantation in order to diffuse the ions and to repair surface damage caused by the ion bombardment.

In addition to ion implantation techniques, other doping methods are known such as diffusion techniques using gaseous, liquid or solid dopant sources. Examples of dopant sources for the diffusion of boron include gaseous diborane ($B_2H_6$), liquid boron tribromide ($BBr_3$) and solid boron nitride (BN). Other dopant sources and specific techniques are well known in the art of semiconductor fabrication.

Figure 3B:
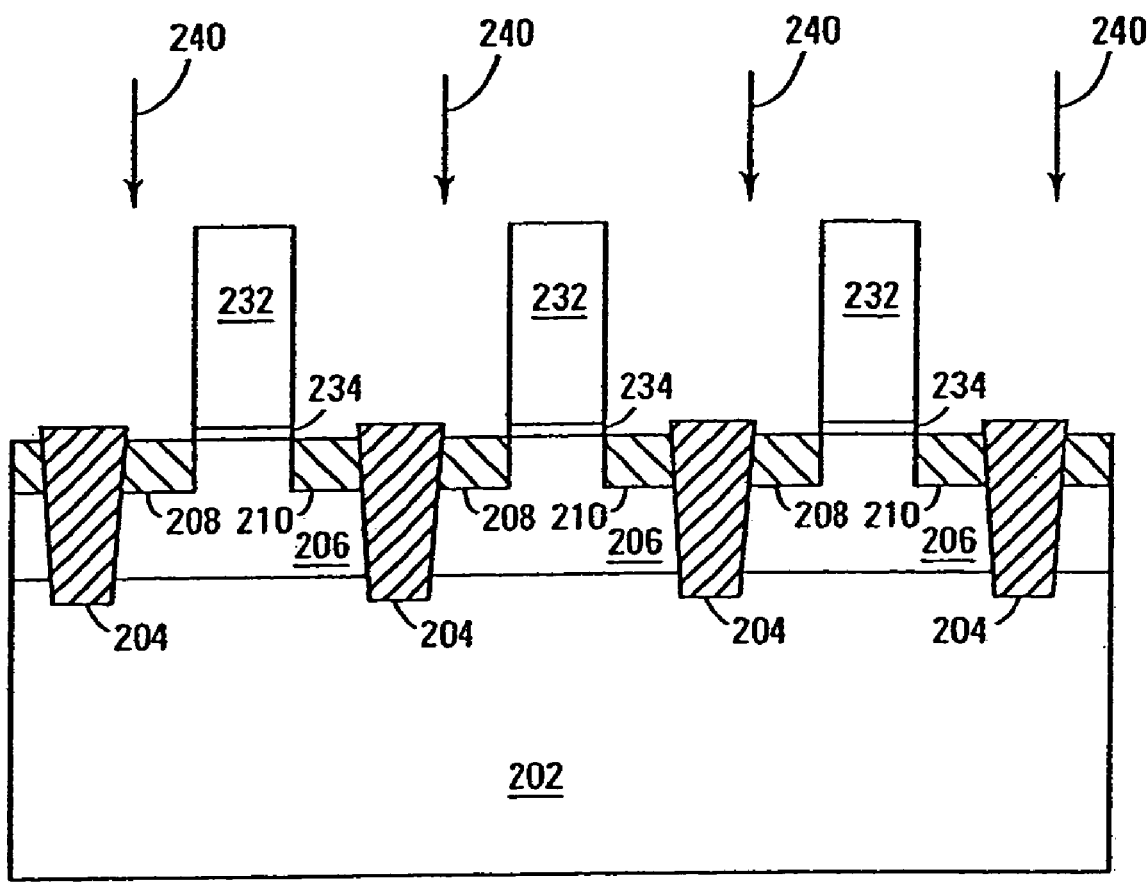

In FIG. 3B, first source/drain regions 208 and second source/drain regions 210 are formed. Although the first and second source/drain regions 208 and 210 are shown to be in contact with the isolation trenches 204, they need not be.

The first and second source/drain regions 208 and 210 have a second conductivity type different from the first conductivity type. For example, where the first conductivity type is a p-type conductivity, the second conductivity type may be an n-type conductivity. Portions of the surface of the substrate 202 between isolation trenches 204 are covered prior to exposing the surface of the substrate 202 to a second dopant species 240 of the appropriate conductivity type. For example, where the second conductivity type is an n-type, the second dopant species 240 has an n-type impurity. Or, where the second conductivity type is a p-type, the second dopant species 240 has a p-type impurity. Furthermore, first and second source/drain regions 208 and 210 generally have a higher doping level than found in the first wells 206. For example, where the first wells 206 have a p-type conductivity, the first and second source/drain regions may have an n+doping level.

Portions of the surface of the substrate 202 are covered in FIG. 3B by a patterned mask 232, typically a photoresist material. This patterned mask 232 protects the surface of the substrate 202, and thus portions of the first wells 206, from exposure to the second dopant species 240. The patterned mask 232 thus separates the first and second source/drain regions 208 and 210 laterally to define a channel region of the future memory cell. A sacrificial oxide layer 234 or other protective layer may be formed between the surface of the substrate 202 and the patterned mask.

Figure 3C:
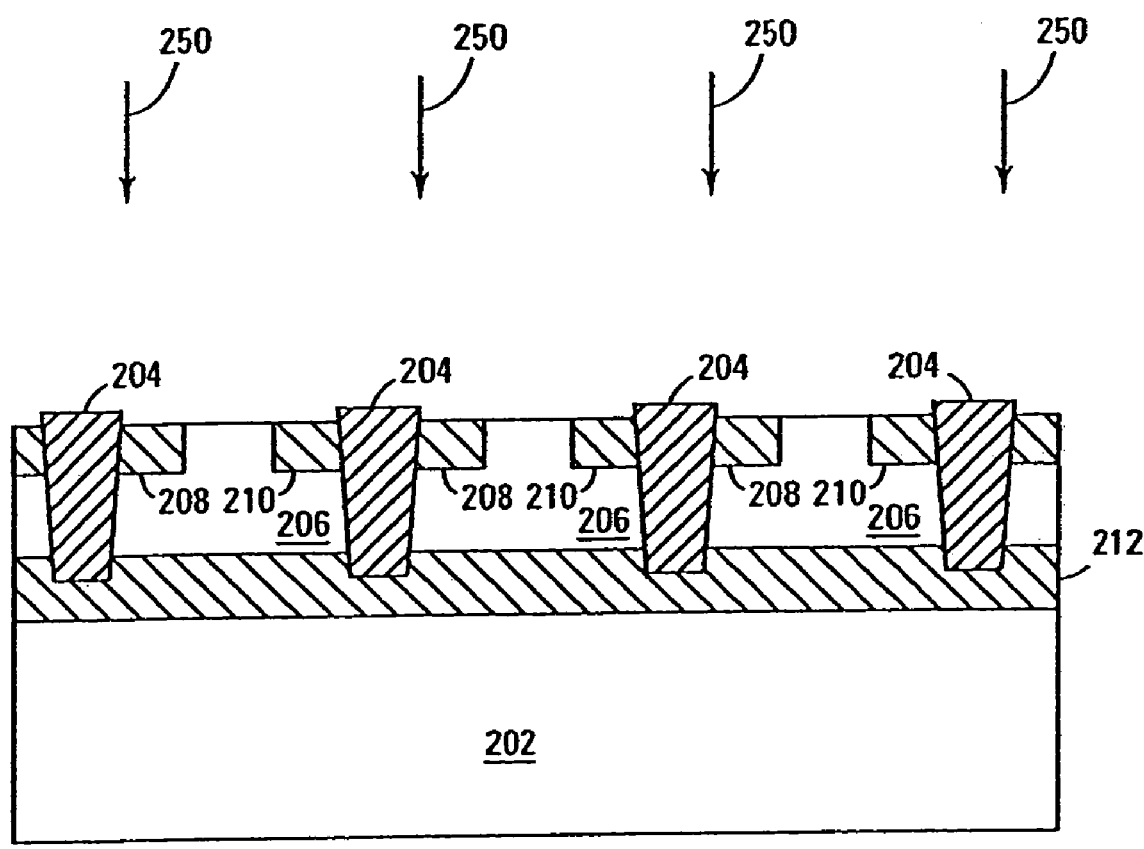

The deep or second well 212 is formed in FIG. 3C to underlie and contact the isolation trenches 204. For one embodiment, the second well 212 is formed using a deep implant of a third dopant species 250. The third dopant species 250 has the second conductivity type. Even where the doping of the first wells 206 results in electrical coupling below the isolation trenches 204, formation of the second well 212 will serve to electrically isolated adjacent first wells 206 if the doping levels are sufficient to form a layer having the second conductivity type in contact with the isolation trenches 204.

The third dopant species 250 may have the same or a different impurity than the second dopant species. For example, the first and second source/drain regions 208 and 210 may be formed with an arsenic-based impurity while the second well 212 is formed with a phosphorus-based impurity. Similarly, the second dopant species 240 and the third dopant species 250 may have the same impurity but in a different form. For example, the second dopant species 240 may utilize a phosphorus pentafluoride (PF5) dopant source while the third dopant species 250 utilizes a phosphorus trifluoride (PF3) dopant source. For a further embodiment, the doping technique may vary between forming the first and second source/drain regions 208 and 210 and forming the second well 212. For example, the first and second source/drain regions 208 and 210 may be formed using a diffusion technique while the second well 212 is formed by ion implantation. The second well 212, in conjunction with the isolation trenches 204, further isolates first wells 206 from each other.

For one embodiment, the second well 212 is formed after removal of the patterned mask 232 and any sacrificial layer 234. For another embodiment, the second well 212 is formed prior to the formation of the first and second source/drain regions 208 and 210.

Figure 3D:
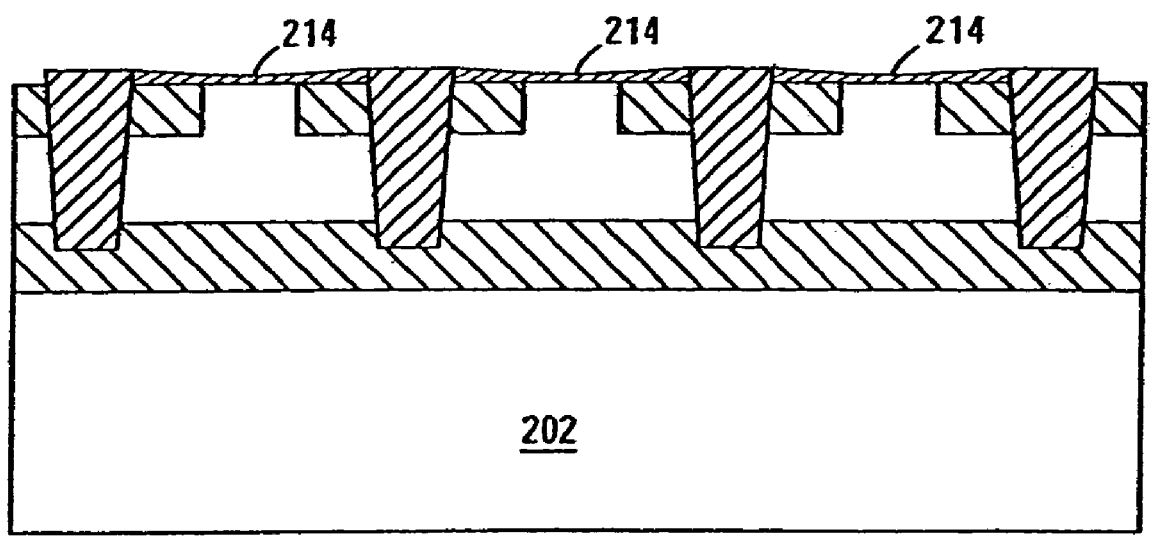

Following formation of the second well 212 and removal of the patterned mask 232 and any sacrificial layer 234, the tunnel dielectric 214 is formed overlying at least the first and second source/drain regions 208 and 210 and the channel region defined between them as shown in FIG. 3D. The tunnel dielectric 214 is a dielectric material such as silicon oxides, silicon nitrides or silicon oxynitrides. For one embodiment, the tunnel dielectric 214 is grown on the surface of the substrate 202, such as by thermal oxidation of exposed silicon areas. For another embodiment, the tunnel dielectric 214 is deposited on the surface of the substrate 202. In addition to covering the first and second source/drain regions 208 and 210 and their intervening channel regions, the tunnel dielectric 214 may further extend over the isolation trenches 204.

Figure 3E:
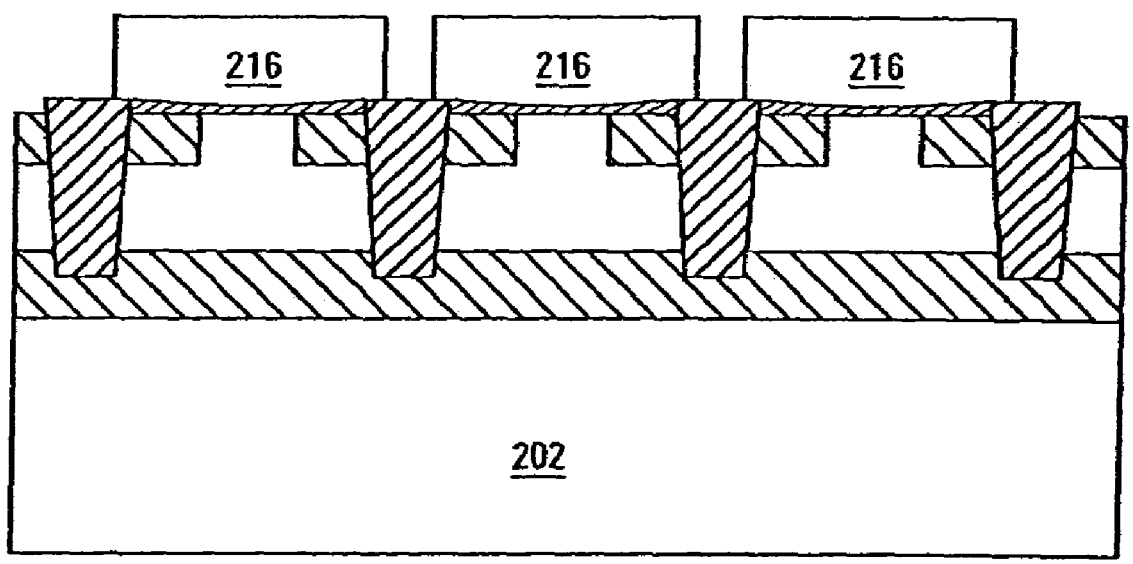

In FIG. 3E, the floating gates 216 are formed. The floating gates 216 are generally some conductive material capable of storing a charge. Conductively-doped polysilicon material is commonly used for such floating gates. For example, the floating gates 216 may contain an n-type polysilicon. For one embodiment, the floating gates 216 are formed by blanket deposition of a polysilicon material, conductively doped either during or following deposition, and patterning of the deposited polysilicon material. The floating gates 216 should extend to be at least overlying the channel regions defined between the first and second source/drain regions 208 and 210. For another embodiment, the floating gates 216 further extend to be overlying the first and second source/drain regions 208 and 210. For a further embodiment, as depicted in FIG. 3E, the floating gates 216 further extend to be overlying a portion of the isolation trenches 204.

Figure 3F:
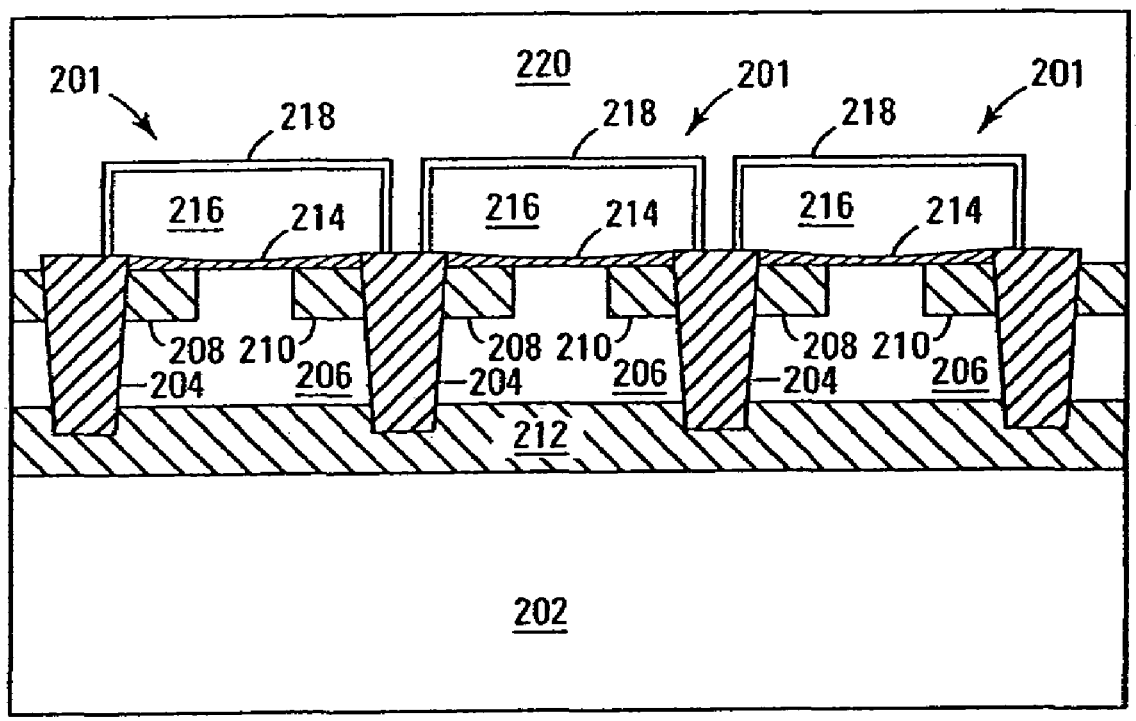

In FIG. 3F, the interlayer dielectric 218 is formed overlying the floating gates 216 and the conductive material 220 are formed overlying the interlayer dielectric 218. The interlayer dielectric 218 is a dielectric material such as silicon oxides, silicon nitrides or silicon oxynitrides. For one embodiment, the interlayer dielectric 218 is deposited on the floating gates 216. While the interlayer dielectric 218 need only cover the floating gates 216, it may further extend to overlie the isolation trenches 204. For another embodiment, the interlayer dielectric 218 is grown on the surface of the floating gates 216, such as by thermal oxidation of exposed polysilicon. The conductive material 220 can contain a single conductive material or conductive composite. For one example, conductively-doped polysilicon material may be used. However, it is more common to use two or more layers of conductive material, with at least one layer containing a metal. For one example, the conductive material 220 may contain a metal silicide layer, such as tungsten silicide ($WSi_2$), overlying a conductively-doped polysilicon layer. A cap layer is generally a dielectric material formed overlying the conductive layers of the word line stack to act as an insulator and barrier layer. Following formation of the conductive material 220, the conductive material 220, the interlayer dielectric 218 and the floating gate 216 are patterned, such as by etching, in a direction generally perpendicular to the first wells 206 to define word lines for the memory array 200.

CONCLUSION

Floating-gate field-effect transistors or memory cells, and methods of their fabrication, have been described. One example of a use for such floating-gate memory cells is non-volatile memory arrays and devices. A column of such floating-gate memory cells are associated with a well containing the source/drain regions for each memory cell in the column. These wells are isolated from source/drain regions of other columns of the array. FN tunneling can be used to program and erase such floating-gate memory cells either on an individual basis or on a bulk or block basis.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. An electronic system, comprising:
   a processor; and
   a non-volatile memory device coupled to the processor, wherein the non-volatile memory device comprises:
      an array of non-volatile floating-gate memory cells arranged in rows and columns; and
      control circuitry for controlling access to the array of memory cells;
   wherein each column of memory cells shares a source and a drain, the source and drain for a column of memory cells being contained in a first well associated with that column of memory cells;
   wherein the first well associated with each column of memory cells is isolated from other first wells of other columns of memory cells;
   wherein each first well is overlying a second well in a many-to-one relationship;
   wherein each first well has a first conductivity type;
   wherein the second well has a second conductivity type different than the first conductivity type.

2. The electronic system of claim 1, wherein the first conductivity type is a p-type conductivity and the second conductivity type is an n-type conductivity.

3. The electronic system of claim 1, wherein the first wells are isolated from each other by isolation trenches interposed between adjacent first wells and by the second well.

4. The electronic system of claim 3, wherein the second well is underlying and in contact with the isolation trenches.

* * * * *

UNITED STATES PATENT AND TRADEMARK OFFICE
CERTIFICATE OF CORRECTION

PATENT NO. : 7,199,422 B2 Page 1 of 1
APPLICATION NO. : 11/006177
DATED : April 3, 2007
INVENTOR(S) : Chun Chen, Andrei Mihnea and Kirk Prall It is certified that error appears in the above-identified patent and that said Letters Patent is hereby corrected as shown below:

Column 7, line 4, replace "is ome" with --is some--.

Signed and Sealed this

Twenty-seventh Day of November, 2007

JON W. DUDAS
*Director of the United States Patent and Trademark Office*